Figure 1:
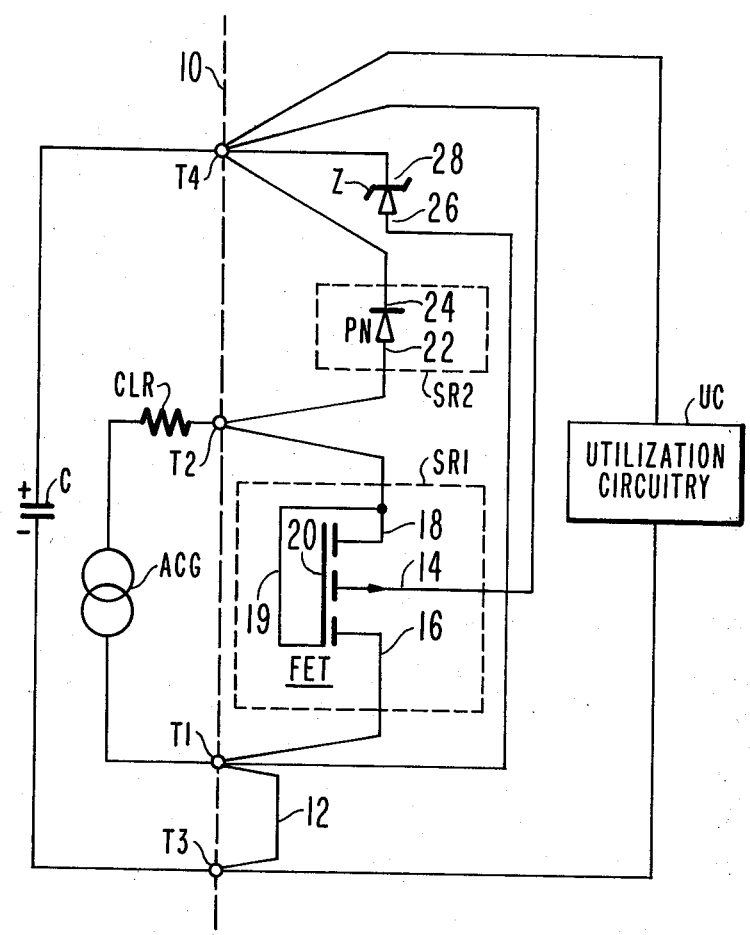

United States Patent [19]

Goldman et al.

[11] 4,276,592
[45] Jun. 30, 1981

[54] A-C RECTIFIER CIRCUIT FOR POWERING MONOLITHIC INTEGRATED CIRCUITS

[75] Inventors: Michael B. Goldman; George I. Morton, both of Belle Mead, N.J.

[73] Assignee: RCA Corporation, New York, N.Y.

[21] Appl. No.: 4,845

[22] Filed: Jan. 19, 1979

[30] Foreign Application Priority Data

Jul. 6, 1978 [GB] United Kingdom ............... 29091/78

[51] Int. Cl.³ .............................................. H02M 1/00
[52] U.S. Cl. ..................................... 363/147; 357/41; 363/127
[58] Field of Search ........................................ 363/147

[56] References Cited

U.S. PATENT DOCUMENTS

| | | | |
|---|---|---|---|
| 3,541,357 | 11/1970 | Kram | 357/48 X |
| 3,649,887 | 3/1972 | Keller et al. | 357/48 |
| 3,806,741 | 4/1974 | Smith | 307/304 |
| 4,027,325 | 5/1977 | Genesi | 357/86 X |
| 4,142,114 | 2/1979 | Green | 307/304 |

OTHER PUBLICATIONS

IBM Technical Disclosure Bulletin, "MOSFET Substrate Bias-Voltage Generator", H. Frantz & G. Y. Sonoda, vol. 11, No. 10, Mar. 1969, p. 1219.
"Monolithic Supply Powered by 110V.", *Electronics*, Mar. 2, 1978, pp. 41–42.

*Primary Examiner*—William M. Shoop
*Attorney, Agent, or Firm*—Allen LeRoy Limberg; Eric P. Herrmann; Allan J. Jacobson

[57] ABSTRACT

A self-biased MOSFET with suitably biased substrate is used as one of the rectifiers in a rectifier circuit for converting a-c power to d-c power for application to a monolithic integrated circuit of which the rectifier circuit is a part. This avoids the parasitic transistor action which would accompany the use of an isolated pn semiconductor junction, which parasitic transistor action undesirably discharges a storage capacitor connected across the output of the rectifier circuit.

7 Claims, 3 Drawing Figures

A-C RECTIFIER CIRCUIT FOR POWERING MONOLITHIC INTEGRATED CIRCUITS

This application relates to circuitry for rectifying a-c power to provide d-c power to a monolithic integrated circuit, the rectifier means of which circuitry is susceptible of being included in the monolithic integrated circuit.

A well-known rectifier circuit has first and second terminals, between which an a-c input current is applied, and third and fourth terminals, between which utilization circuitry is connected. A storage capacitor and possibly a shunt voltage regulating element is also connected between the third and fourth terminals. The first and third terminals are connected together, typically by a direct connection without intervening elements. First rectifier means is connected at anode and cathode, respectively, to the first terminal and to the second terminal. Second rectifier means are connected at anode and cathode respectively to the second terminal and to the fourth terminal.

The second rectifier means is poled to conduct current to charge the storage capacitor, to a positive potential for example, during the positive half cycle of the applied a-c voltage source. The first rectifier means is arranged to conduct during the negative half cycle in order to limit the reverse bias potential impressed across the second rectifier means during this period, to a value equal to the rectifier d-c potential plus the forward potential drop across the first rectifier means. In the absence of the first rectifier it is possible to subject the second rectifier means to a reverse bias potential of a value equal to twice the peak potential of the a-c source.

Conventionally, in monolithically integrated circuits, rectifier means are realized using pn junction devices. In monolithically integrating the rectifier circuit described in the preceding paragraph, one would be led to isolate the pn junction in the first rectifier means from its underlying substrate by another pn junction. The present inventors have found that this other pn junction cooperates with the isolated pn junction to form a parasitic transistor, which undesirably discharges the storage capacitor.

The inventors considered whether the first rectifier means might be constructed using an insulated gate field effect transistor self-biased by drain-to-gate connection. More particularly they considered whether a metal-oxide-semiconductor field effect transistor (a MOSFET) might be so used. They have found that such a semiconductor rectifier structure can be successfully used, where the MOSFET is disposed in a substrate or a well in a substrate such that the well or substrate is charged to a potential equal to the rectifier potential and ensuring that the substrate (well) is not connected to the source electrode. In this arrangement the pn junctions formed by the drain and source region with respect to the substrate in which they are disposed will be subjected to a maximum reverse bias essentially equal to the rectified potential plus the threshold potential of the MOSFET.

Figure 2:
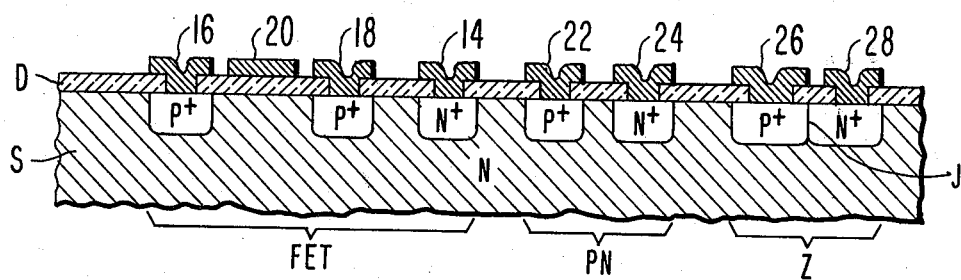
Figure 3:
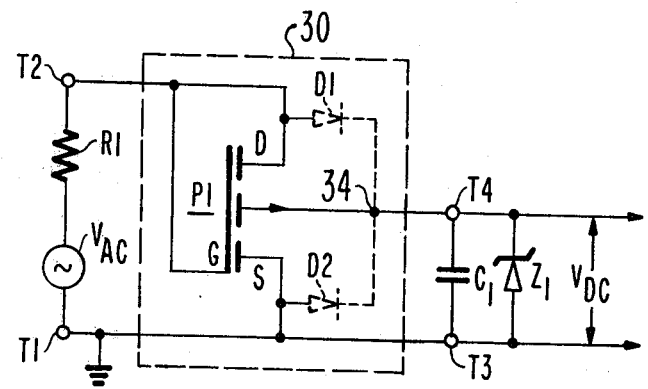

In the drawing:

FIGS. 1 and 3 are schematic diagrams of two rectifier circuits that are embodiments of the present invention and FIG. 2 is a cross-sectional view of elements used as the rectifying means in that embodiment.

In FIG. 1 dashed line 10 represents the interface between monolithic integrated circuitry to the right of line 10 and off-chip circuitry to the left of line 10. First terminal T1, second terminal T2, third terminal T3 and fourth terminal T4 provide for interconnection between the monolithic integrated circuit and the off-chip components and respectively correspond to the first, second, third and fourth terminals described in the preceding paragraphs setting forth the background of the invention. Terminals T1 and T3 are connected to each other, by direct interconnection 12. The FET is a p-channel device in an n-type substrate and a positive potential is desired at terminal T4 with respect to T3. It is to be realized that where the utilization means requires substantially no current, capacitor C may also be incorporated on the monolithic circuit.

A-c voltage supplied by a generator ACG is applied via a current limiting resistor CLR between terminals T1 and T2. The first rectifier means is a semiconductor rectifier SR1 connected between T1 and T2 to conduct current flowing in a first polarity between terminal T1 and T2 with relative ease compared to current flowing or attempting to flow in a second and opposite polarity. More particularly, the semiconductor rectifier SR1 is a p-channel enhancement mode metal-oxide-semiconductor field effect transistor or MOSFET having a source electrode 16 connected to terminal T1 and having a drain electrode 18 connected to terminal T2. Direct coupled drain-to-gate feedback shown in FIG. 1 as being applied by a direct connection 19 between drain electrode 18 and gate electrode 20 of FET conditions the p-channel field effect transistor to conduct current when terminal T2 is negative with respect to terminal T1 and not to conduct current when terminal T2 is positive with respect to terminal T1.

So in the half cycles when the a-c voltage supplied by generator ACG is of such polarity that the potential at terminal T2 is negative relative to that at terminal T1, the p-channel transistor conducts between its source and drain electrodes, provided the value of the gate-source potential exceeds the threshold or turn-on potential of the transistor. The transistor is designed such that when biased into conduction the majority of the a-c potential applied by ACG is dropped across resistor CLR, and the drain to source potential drop of FET is close to its threshold potential. The potential impressed across terminals T1 and T2 is thus limited to this value during the negative half cycles. At the same time the second semiconductor rectifier SR2 shown as comprising a simple pn junction PN with its anode 22 connected to terminal T2 blocks current flow from terminal T4 to terminal T2, preventing C from discharging through the charging circuit.

On the other half cycles when the a-c voltage applied by generator ACG is of such polarity that the potential at terminal T2 is positive compared to that at terminal T1, the gate potential of FET is more positive than its source potential biasing FET to be non-conductive between its drain and source electrodes. Current flows through T2 to terminal T4 to charge capacitor C via the anode-cathode circuit of rectifier or diode SR2 formed by semiconductor junction PN. The charge supplied to capacitor C develops a positive direct potential between terminals T3 and T4, which potential is applied to utilization circuitry UC within the integrated circuit.

If desired, the magnitude of the direct potential appearing between terminals T3 and T4 may be shunt regulated by a shunt regulator means connected between terminals T3 and T4 for diverting charging current from storage capacitor C when the potential thereacross tends to exceed a prescribed value. In FIG. 1 an avalanche diode Z having an anode 26 connected to terminal T3 and having a cathode 28 connected to terminal T4 is such a shunt regulator means.

FIG. 2 is a cross-section of a portion of a CMOS integrated circuit including structures for realizing field effect transistor FET, the pn junction PN used as a semiconductor rectifier SR2, and the avalanche diode Z. The structural elements for each device appears above the bracket over its identification letters. The CMOS integrated circuit conventionally is built on an N-doped substrate S, the preferred surface of which has an overlying insulating dielectric layer D, which is selectively etched away to permit metal electrodes to contact the semiconductor material.

The field effect transistor FET includes P+ diffusions into the surface of the substrate S underlying its source and drain electrodes 16 and 18, and a p-channel is induced between these P+ regions by electrostatic induction through dielectric layer D by application of relatively negative gate potential applied to gate electrode 20 with respect to the substrate potential. An ohmic contact between substrate electrode 14 and the substrate S is facilitated by an N+ diffusion into the surface of substrate S under electrode 14.

The pn semiconductor junction PN is formed between a P+ region underlying its anode electrode 22 and the substrate S. Cathode electrode 24 overlays an N+ region facilitating the making of ohmic contact between cathode electrode 24 and substrate S. Avalanche diode Z is provided by the junction J between P+ and N+ regions underlying its anode electrode 26 and cathode electrode 28, respectively. The integrated circuit layout may be modified to be more economical of chip area, for example by combining the P+ regions beneath electrodes 18 and 22 such that the combined region functions as both the drain region of FET and the anode of rectifier SR2 and the N+ regions underlying electrodes 14 and 24 may be replaced by a single shared N+ region.

In the above arrangement the substrate is the cathode connection of the rectifying junction of SR2, which substrate is contiguous with the substrate of the FET such that the interconnection of the substrate connection 14 and cathode 24 of the FIG. 1 circuit is inherent to the structure. On the other hand where the FET is isolated in the substrate or realized in discreet form a separate connection may be required.

The connection of the substrate electrode 14 to terminal T4 is advantageous when the utilization circuitry UC includes further P-channel field effect transistors, "utilizing transistors", reposing in the N-material substrate S. Each such utilizing transistor receives through the substrate a substrate potential that is as positive as any potential that may be derived from the potential between terminals T3 and T4 for application to its source electrode. This may eliminate the need for metalization between terminal T4 and the portion of the substrate region in which the utilizing transistor reposes, or will at least reduce the cross-section of the metalization required.

The FIG. 3 circuit includes an FET transistor P1 which is a discreet device utilized to provide the functions of both SR1 and SR2 in the FIG. 1 circuit. FET P1 is a four terminal device, i.e., drain (D), source (S), gate (G) and substrate (34). Parasitic diodes D1 and D2 represent the inherent pn junctions formed respectively between the substrate in which the transistor is disposed and the drain and source regions of the FET. The gate and drain electrodes are interconnected to rectifier terminal T2 while the source electrode is connected to T1. The substrate electrode is connected to rectifier output terminal T4 to which storage capacitor C1 and shunt regulator Z1 are also connected.

During the times when $V_{AC}$ conditions T2 to be positive with respect to T1, P1 is biased off. A current conduction path exists through resistor R1, through parasitic diode D1 to substrate 34, to charge storage capacitor C1 with the interconnection between terminals T3 and T1 completing the circuit. The drain-source circuit of P1 is effectively disconnected from the circuit and parasitic diode D2 is reverse biased by the relatively positive and relatively negative potentials respectively at terminals 34 and T1, the reverse bias potential limited to the avalanche potential sustained by Z1. Conversely, when $V_{AC}$ causes terminal T1 to be positive with respect to T2, the current path of least resistance consists of the source-drain circuit of P1 and resistor R1. The potential across T1 and T2 is limited to the drain-source "on" voltage of the diode-connected transistor P1 which is typically in the order of 1 or 2 volts. Despite the anode of D2 receiving a relatively positive potential diode D2 is maintained reverse biased by the potential stored on C1 which is impressed across its anode-cathode circuit. Similarly diode D1 is reverse biased by the potential equal to that stored on capacitor C1 plus the on potential of P1 as is easily determined by application of Kirchoff's circuit analysis.

The reverse bias potential impressed across diodes D1 and D2 is determined by the shunt regulator Z1 or the load applied across terminals T3 and T4, which potential is easily determined to be sufficiently low to insure that neither D1 nor D2 approach an avalanche condition and inadvertently discharge storage capacitor C1.

The foregoing description of circuit operation applies to both the FIG. 1 and FIG. 3 circuits. In arranging the circuit in either monolithic or discreet form the current rectified by the drain-substrate junction must be such that the current density does not cause excess ohmic heating so as to harm the device.

The present invention while described in a PMOS environment, it can be embodied in other integrated circuit technologies, NMOS or CMOS, for example. In linear bipolar circuitry, as a further example, SR1 might comprise a p-channel FET disposed in an N-doped isolation tub and SR2 might comprise a vertical-structure NPN transistor self-biased by direct-coupled collector-to-base feedback, the P-doped substrate underlying the N-doped isolation tubs being reverse-biased respective to the tubs by connection to terminal T1. The following claims should be liberally construed to take into account all rectifier circuits which embody the spirit and teaching of the invention hereinbefore described.

What I claim is:
1. A rectifier circuit comprising
   first and second terminals for receiving an alternating current therebetween;
   a third terminal at which a rectified potential is available;
   a field effect transistor having drain and source semiconductor regions of a first conductivity type disposed in a semiconductor substrate of an opposite conductivity type, said drain source regions forming pn junctions with the substrate; and further having a gate electrode;

means connecting the drain and source regions of said field effect transistor respectively to said second and first terminals, and means connecting the gate electrode to said second terminal;

means connecting the semiconductor substrate to said third terminal;

an avalanche diode comprising a first semiconductor region of said first conductivity type disposed in said semiconductor substrate and forming a pn junction with a second semiconductor region of the opposite conductivity type, wherein said second semiconductor region is disposed in and is of the same conductivity type as said semiconductor substrate, thereby providing a connection between said second semiconductor region and said semiconductor substrate; and means connecting said first semiconductor junction to said first terminal.

2. A rectifier circuit as set forth in claim 1 further comprising a capacitor connected between said first and third terminals.

3. A rectifier circuit comprising first and second terminals for receiving an alternating current therebetween, third and fourth terminals for connection of a load therebetween, means connecting said first and third terminals, a storage capacitor connected between said third and fourth terminals, a first semiconductor rectifier connected between said second and first terminals for conducting a first polarity of said alternating current with relative ease compared to a second polarity of said alternating current opposite to said first polarity, and a second semiconductor rectifier connected between said second and fourth terminals for conducting the second polarity of said alternating current with relative ease compared to its first polarity, wherein said first semiconductor rectifier includes a field effect transistor having a source region with an associated source electrode connected to said first terminal, having a drain region with an associated drain electrode connected to said second terminal, having a gate or control electrode to which said second terminal is direct coupled, having a substrate region with an associated substrate electrode connected to said fourth terminal, having a junction between its source and substrate regions, and having a junction between its drain and substrate regions, the improvement comprising:

avalanche diode means connected between said third and fourth terminals for regulating the maximum potential between said third and fourth terminals, said avalanche diode means including first and second semiconductor regions of opposite conductivity type, wherein said second semiconductor region is disposed in, and is of the same conductivity type as said substrate region of said field effect transistor, thereby providing a connection between said second semiconductor region and said substrate region.

4. A rectifier circuit as set forth in claim 2 wherein said second semiconductor rectifier consists of the junction between the drain and substrate regions of said field effect transistor.

5. A rectifier circuit as set forth in claim 2 wherein said second semiconductor rectifier includes the junction between the drain and substrate regions of said field effect transistor.

6. A rectifier circuit as set forth in claim 3 wherein said first semiconductor junction is disposed in pn junction forming relation with said substrate region and said second semiconductor region.

7. A rectifier circuit as set forth in claim 3 wherein said first semiconductor region is directly connected to the source region of said field effect transistor.

* * * * *